(12) United States Patent
Cheng et al.

(10) Patent No.: US 9,873,241 B2
(45) Date of Patent: Jan. 23, 2018

(54) METHOD AND DEVICE FOR FABRICATING FLEXIBLE DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 651 days.

(21) Appl. No.: 14/353,722

(22) PCT Filed: Dec. 16, 2013

(86) PCT No.: PCT/CN2013/089610
§ 371 (c)(1),
(2) Date: Apr. 23, 2014

(87) PCT Pub. No.: WO2015/007054
PCT Pub. Date: Jan. 22, 2015

(65) Prior Publication Data
US 2015/0075706 A1    Mar. 19, 2015

(30) Foreign Application Priority Data

Jul. 19, 2013  (CN) .......................... 2013 1 0306194

(51) Int. Cl.
*G02F 1/1333*  (2006.01)
*B32B 37/12*  (2006.01)
(Continued)

(52) U.S. Cl.
CPC .............. *B32B 37/12* (2013.01); *B32B 37/02* (2013.01); *B32B 43/006* (2013.01); *C09J 7/02* (2013.01);
(Continued)

(58) Field of Classification Search
CPC ......... H01L 21/6835; H01L 2221/6835; H01L 2221/68381; H01L 2221/68386;
(Continued)

(56) References Cited

U.S. PATENT DOCUMENTS 8,436,122 B2   5/2013   Kho et al.
2007/0297038 A1   12/2007   Chopra et al.
2010/0301338 A1   12/2010   Abe

FOREIGN PATENT DOCUMENTS

CN   1862329 A   11/2006
CN   101443429 A   5/2009
(Continued)

OTHER PUBLICATIONS

Chinese Office Action of Chinese Application No. 201310306194.3, dated Jun. 17, 2015 with English translation.
(Continued)

*Primary Examiner* — Carson Gross
(74) *Attorney, Agent, or Firm* — Collard & Roe, P.C.

(57) ABSTRACT

A method for fabricating a flexible display device is provided. The method comprises: attaching a first flexible substrate of the flexible display device onto a conductive adhesive layer, wherein the conductive adhesive layer is disposed on a conductive rigid substrate; fabricating other parts of the flexible display device on the first flexible substrate; aging the conductive adhesive layer; peeling off the flexible substrate from the conductive rigid substrate so as to obtain the flexible display device.

10 Claims, 2 Drawing Sheets

(51) Int. Cl.
| | |
|---|---|
| *H01L 21/683* | (2006.01) |
| *B32B 37/02* | (2006.01) |
| *B32B 43/00* | (2006.01) |
| *C09J 7/02* | (2006.01) |
| *C09J 9/02* | (2006.01) |
| *H01L 51/00* | (2006.01) |
| *H01L 27/32* | (2006.01) |
| *G02F 1/136* | (2006.01) |

(52) U.S. Cl.
CPC ............. *C09J 7/026* (2013.01); *C09J 7/0292* (2013.01); *C09J 9/02* (2013.01); *G02F 1/133305* (2013.01); *H01L 21/6835* (2013.01); *H01L 51/003* (2013.01); *H01L 51/0097* (2013.01); *B32B 2307/202* (2013.01); *B32B 2311/04* (2013.01); *B32B 2311/08* (2013.01); *B32B 2311/12* (2013.01); *B32B 2311/20* (2013.01); *B32B 2311/22* (2013.01); *B32B 2311/24* (2013.01); *B32B 2311/30* (2013.01); *B32B 2325/00* (2013.01); *B32B 2333/00* (2013.01); *B32B 2355/00* (2013.01); *B32B 2379/00* (2013.01); *B32B 2379/08* (2013.01); *B32B 2383/00* (2013.01); *B32B 2386/00* (2013.01); *B32B 2457/20* (2013.01); *B32B 2457/202* (2013.01); *B32B 2457/206* (2013.01); *C09J 2201/602* (2013.01); *G02F 2001/13613* (2013.01); *H01L 27/3244* (2013.01); *H01L 2221/6835* (2013.01); *H01L 2221/68381* (2013.01); *H01L 2221/68386* (2013.01); *H01L 2251/5338* (2013.01); *H01L 2251/5369* (2013.01); *H01L 2251/562* (2013.01); *H01L 2924/0002* (2013.01); *Y02E 10/549* (2013.01); *Y10T 428/28* (2015.01); *Y10T 428/2804* (2015.01); *Y10T 428/2852* (2015.01); *Y10T 428/2857* (2015.01); *Y10T 428/2891* (2015.01)

(58) Field of Classification Search
CPC ....... H01L 2251/5338; H01L 2251/562; H01L 51/003; H01L 51/0097; G02F 1/133305; C09J 9/02; C09J 2201/602; B32B 2307/202; B32B 2311/04; B32B 11/08; B32B 2311/12; B32B 2457/202; B32B 2457/206
USPC ...... 156/247; 428/343, 344, 355 AC, 355 R, 428/356
See application file for complete search history.

(56) References Cited

FOREIGN PATENT DOCUMENTS

| | | |
|---|---|---|
| CN | 101901814 A | 12/2010 |
| CN | 103413775 A | 11/2013 |
| CN | 203377205 U | 1/2014 |
| JP | 2001146578 A | 5/2001 |
| KR | 10-1279257 B1 | 6/2013 |

OTHER PUBLICATIONS

First Chinese Office Action of Chinese Application No. 2013103061943, dated Jun. 17, 2015 with English translation.
Second Chinese Office Action of Chinese Application No. 201310306194.3, dated Nov. 9, 2015 with English translation.
Notification to Grant the Patent Right (Notice of Allowance) for Chinese Application No. 2013103061943 with English translation, dated Mar. 7, 2016.
The Issued Patent for Chinese Application No. 201310306194.3 (CN 103413775 B) granted on Apr. 6, 2016 in Chinese with the Chinese granted claims with an English translation.
English translation of the International Preliminary Report on Patentability and Written Opinion of the International Searching Authority of PCT/CN2013/089610, dated Jan. 19, 2016.
English Translation of the International Search Report of PCT/CN2013/089610 published in English dated Jan. 22, 2015.
International Search Report, International Preliminary Report on Patentability and Written Opinion of the International Searching Authority of PCT/CN2013/089610 in Chinese, dated May 14, 2014.

METHOD AND DEVICE FOR FABRICATING FLEXIBLE DISPLAY DEVICE

CROSS REFERENCE TO RELATED APPLICATIONS

This application is the National Stage of PCT/CN2013/089610 filed on Dec. 16, 2013, which claims priority under 35 U.S.C. § 119 of Chinese Application No. 201310306194.3 filed on Jul. 19, 2013, the disclosure of which is incorporated by reference. The international application under PCT article 21(2) was not published in English.

TECHNICAL FIELD

Embodiments of the invention relate to method and device for fabricating a flexible display device.

BACKGROUND

Flexible displays have many advantages such as impact-resistant, vibration-resistant, lightweight, compact in volume, portable and so on.

Currently, materials for flexible display are generally divided into three categories, that is, E-papers (or flexible electrophoretic display), flexible Organic Light Emitting Diodes (OLEDs) and flexible liquid crystals.

A popular method conventionally used for fabricating a flexible display is an attach and remove method, in which a flexible substrate is attached onto a conductive rigid substrate via an adhesive layer, and the flexible substrate is peeled from the conductive rigid substrate after completing fabrication of the flexible display, thereby forming the flexible display. However, during operation, such a peeling method results in generation of electro-static charges which fail to be immediately discharged via the conductive rigid substrate, thus damaging the flexible display and decreasing the non-defective rate.

SUMMARY

An embodiment of the invention provides a method for fabricating a flexible display device comprising: attaching a first flexible substrate of the flexible display device onto a conductive adhesive layer, wherein the conductive adhesive layer is disposed on a conductive rigid substrate; fabricating other parts of the flexible display device on the first flexible substrate; aging the conductive adhesive layer; peeling off the flexible substrate from the conductive rigid substrate so as to obtain the flexible display device.

In an example, the conductive adhesive layer is an adhesive into which conductive particle or conductive polymer is added.

In an example, the conductive adhesive layer further comprises silane adhesive, polyimide adhesive, or acrylate adhesive and conductive particle or conductive polymer.

In an example, the conductive particle comprises gold, silver, copper, aluminum, zinc, iron, nickel conductive particles, the conductive polymer comprise polyacetylene, polythiophene, polypyrrole, polyaniline, polyhenylene, polyphenylene vinylene(PPV) or polydiacetylene.

In an example, the conductive rigid substrate is a metal substrate, or the conductive rigid substrate comprises a conductive layer and a non-conductive rigid substrate.

In an example, the conductive layer is an indium tin oxide layer, the non-conductive rigid substrate is a glass substrate.

In an example, the step of aging the adhesive layer comprises aging the adhesive layer by scanning a back side of the conductive rigid substrate with a laser beam or by heating.

Another embodiment of the invention provides a device for fabricating a flexible display device comprising: a conductive adhesive layer for attaching a flexible substrate of a flexible display device; and a conductive rigid substrate supporting the conductive adhesive layer.

In an example, the conductive adhesive layer is an adhesive into which conductive particle or conductive polymer is added.

In an example, the conductive adhesive layer comprises silane adhesive, polyimide adhesive, or acrylate adhesive and conductive particle or conductive polymer.

In an example, the conductive particle comprises gold, silver, copper, aluminum, zinc, iron, nickel conductive particle, the conductive polymer comprises polyacetylene, polythiophene, polypyrrole, polyaniline, polyhenylene, polyphenylene vinylene(PPV) or polydiacetylene.

In an example, the conductive rigid substrate is a metal substrate, or the conductive rigid substrate comprises a conductive layer and a non-conductive rigid substrate.

In an example, the conductive layer is an indium tin oxide layer, the non-conductive rigid substrate is a glass substrate.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not (imitative of the invention.

DETAILED DESCRIPTION

Figure 1:
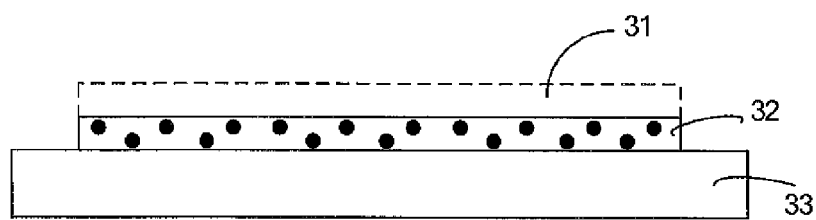
FIG. 1 schematically illustrates a configuration of a device for fabricating a flexible display in accordance with an embodiment of the invention.

Embodiments of the invention provide a method and a device for fabricating a flexible display device, such that electrostatic charges generated during fabricating the flexible display device are timely discharged via a conductive rigid substrate, preventing the electro-static charges from damaging the flexible display and increasing the non-defective rate of the fabricated flexible display device.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An embodiment of the invention provides a method for fabricating a flexible display device comprising:

S1: attaching a first flexible substrate of the flexible display device onto a conductive adhesive layer, wherein the conductive adhesive layer is disposed on a conductive rigid substrate;

S2: fabricating other parts of the flexible display device on the first flexible substrate;

S3: aging the conductive adhesive layer;

S4: peeling off the flexible substrate from the conductive rigid substrate so as to obtain the flexible display device.

Herein, the step S3 comprises aging the adhesive layer by scanning a back side of the conductive rigid substrate with a laser beam or by heating.

In the above fabrication method, the conductive adhesive layer comprises an adhesive and conductive particles or conductive polymers dispersed in the adhesive. The adhesive may comprise silane adhesive, polyimide adhesive, or acrylate adhesive; the conductive particles may be gold, silver, copper, aluminum, zinc, iron, nickel conductive particles; the conductive polymers comprise polyacetylene, polythiophene, polypyrrole, polyaniline, polyhenylene, polyphenylene vinylene(PPV) or polydiacetylene. The conductive rigid substrate is for example a metal substrate, or the conductive rigid substrate comprises for example a conductive layer and a non-conductive rigid substrate, wherein the conductive layer is an indium tin oxide layer, the non-conductive rigid substrate is a glass substrate. In this case, electro-static charges generated during peeling off the flexible substrate from the conductive adhesive layer can be discharged via the conductive rigid substrate by using the conductive adhesive layer, increasing the non-defective rate of the fabricated flexible display device.

In an example, the step S2 of fabricating other parts of the flexible display device on the flexible substrate comprises:

S11: sequentially fabricating a thin film transistor (TFT), a first passivation layer on the first flexible substrate in a direction away from the first flexible substrate, wherein the TFT may have a top gate configuration, in which an active layer, a gate insulation layer, a gate electrode, an interlayer insulation layer, a drain electrode and a source electrode are successively formed in a direction away from the first flexible substrate. The TFT can also have a bottom gate configuration, in which a gate electrode, a gate insulation layer, an active layer, a drain electrode and a source electrode are successively formed in a direction away from the first flexible substrate.

S12: fabricating an anode by forming a via hole in the first passivation layer.

S13: fabricating an anode, a pixel defining layer, a RGB EL layer and a cathode on the first passivation layer.

S14: attaching a second flexible substrate.

In the above fabrication method, the second flexible substrate is the flexible substrate attached on the conductive adhesive layer in the embodiment of the invention.

The above method is for exemplary purpose only. There may be different fabrication methods according to different configurations of the flexible display devices.

The conductive rigid substrate is a metal substrate, or the conductive rigid substrate comprises a conductive layer and a non-conductive rigid substrate, wherein the conductive layer comprises an indium tin oxide layer, and the non-conductive rigid substrate comprises a glass substrate. The conductive rigid substrate is configured for coating the conductive adhesive layer for attaching the flexible substrate and the conductive rigid substrate thereon. Meanwhile, the conductive adhesive layer is aged by scanning the back side of the conductive rigid substrate with a laser beam or by heating. In this way, the flexible substrate may be peeled off from the conductive rigid substrate so as to obtain the flexible display device.

An embodiment of the invention further provides a device for fabricating a flexible display device. With reference to FIG. 1, it is seen that the device for fabricating the flexible display device comprises a conductive adhesive layer 32 for attaching a flexible substrate 31 of a flexible display device; and a conductive rigid substrate 33 disposed under the conductive adhesive layer.

Figure 2:
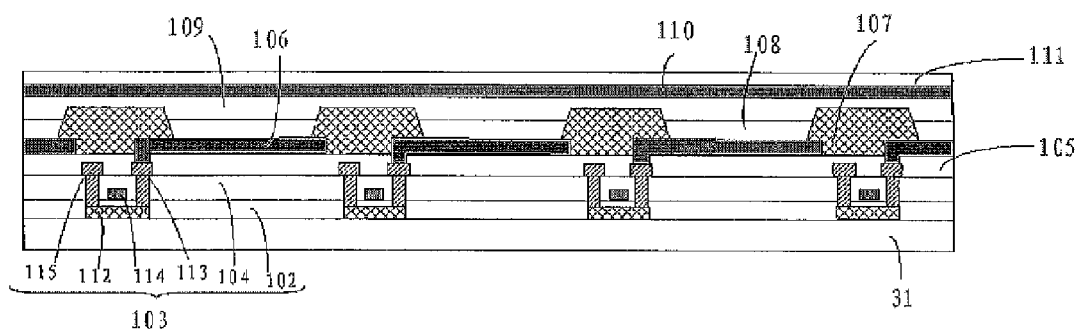
FIG. 2 schematically illustrates a configuration of other parts of the flexible display fabricated on a first flexible substrate.

Herein, the flexible substrate 31 is configured for being peeled from the conductive rigid substrate 33 after aging the conductive adhesive layer 32 so as to obtain the flexible display device. The flexible substrate 31 is further configured for fabricating other parts of the flexible display device thereon. With reference to FIG. 2, it is seen that other parts of the flexible display device on the flexible substrate 31 sequentially comprise: a TFT 103, a first passivation layer 105, an anode 106, a pixel defining layer 107, a RGB organic EL layer 108, a cathode 109, an adhesive 110 and a second flexible substrate 111. Herein the TFT 103 comprises the following layers in an upward direction: an active layer 112, a gate insulation layer 102, a gate electrode 114, an interlayer insulation layer 104, a drain electrode 113 and a source electrode 115.

Figure 3:
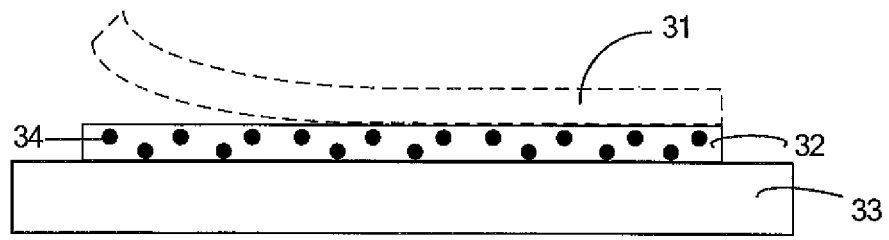
FIG. 3 schematically illustrates a configuration of a device for fabricating a flexible display in accordance with an embodiment of the invention.
Figure 4:
FIG. 4 schematically illustrates a configuration of a device for fabricating a flexible display in accordance with an embodiment of the invention.

The conductive adhesive layer 32 is configured for connecting the flexible substrate 31 with the conductive rigid substrate 33 and for timely conducting the electro-static charges generated during peeling off the flexible substrate 31 from the conductive rigid substrate 33 to the conductive rigid substrate 33 and then having the charges further discharged from the conductive rigid substrate 33, such that the non-defective rate of the fabricated flexible substrate device is increased. With reference to FIGS. 3 and 4, the conductive adhesive layer 32 comprises for example silane adhesive, polyimide adhesive, or acrylate adhesive and conductive particles 34 or conductive polymers 35 dispersed in the adhesive. The conductive adhesive layer in FIG. 3 is mixed with conductive particles; the conductive particles can be gold, silver, copper, aluminum, zinc, iron, nickel conductive particles. In this way, the adhesive layer for connecting the flexible substrate 31 and the conductive rigid substrate 33 is conductive, the conductive adhesive layer may timely discharge the electro-static charges generated during peeling off the flexible substrate 31 from the conductive rigid substrate 33 via the conductive rigid substrate, thus increasing the non-defective rate of the fabricated flexible substrate device. The conductive adhesive layer 32 in FIG. 4 is mixed with conductive polymers 35; the conductive polymers 35 comprise polyacetylene, polythiophene, polypyrrole, polyaniline, polyhenylene, polyphenylene vinylene(PPV) or polydiacetylene. In this way, the adhesive layer for connecting the flexible substrate 31 and the conductive rigid substrate 33 is conductive, the conductive adhesive layer 32 can timely discharge the electro-static charges generated during peeling off the flexible substrate 31 from the conductive rigid substrate 33 via the conductive rigid substrate, thus making the peeling uniform and increasing the non-defective rate of the fabricated flexible substrate device.

Figure 5:
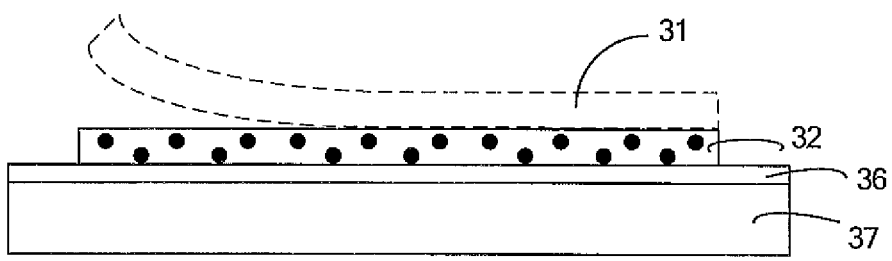
FIG. 5 schematically illustrates a configuration of a device for fabricating a flexible display in accordance with an embodiment of the invention.

The conductive rigid substrate 33 is configured for coating the conductive adhesive layer 32 thereon. The conductive adhesive layer 32 is configured for attaching the flexible substrate 31 to the conductive rigid substrate 33. Meanwhile, the conductive adhesive layer 32 is aged by scanning the back side of the conductive rigid substrate 33 with a laser beam or by heating. In this way, the flexible substrate 31 can be peeled off from the conductive rigid substrate 33 so as to obtain the flexible display device. The conductive rigid substrate 33 is a metal substrate. Alternatively, with reference to FIG. 5, the conductive rigid substrate 33 comprises a conductive layer 36 and a non-conductive rigid substrate 37, wherein the conductive layer 36 is an conductive ITO layer, and the non-conductive rigid substrate 37 is a glass substrate.

In summary, the embodiments of the invention provide a method and a device for fabricating a flexible display device, such that electro-static charges generated during the procedure of fabricating the flexible display device are directly discharged via a conductive adhesive layer and a conductive rigid substrate, preventing the electro-static charges from affecting the peeling effect and increasing the non-defective rate of the fabricated flexible display device.

Though the invention is described in detail in the above with reference to general description and detailed embodiments, modifications and variants are possible obvious to a person of ordinary skills in the art may be made based on the invention. The modifications and variants all belong to the scopes of the invention without departing from the spirits of the invention.

What is claimed is:

1. A method for fabricating a flexible display device, comprising:
attaching a flexible substrate of the flexible display device onto a conductive adhesive layer, wherein the conductive adhesive layer is disposed on a conductive rigid substrate, the conductive rigid substrate is located at a side of the conductive adhesive layer away from the first flexible substrate and is more rigid than the first flexible substrate;
fabricating other parts of the flexible display device on the flexible substrate;
aging the conductive adhesive layer;
peeling off the flexible substrate from the conductive rigid substrate so as to obtain the flexible display device.

2. The method of claim 1, wherein the conductive adhesive layer is an adhesive into which conductive particle or conductive polymer is added.

3. The method of claim 2, wherein the conductive particle comprises gold, silver, copper, aluminum, zinc, iron, nickel conductive particles, the conductive polymer comprise polyacetylene, polythiophene, polypyrrole, polyaniline, polyhenylene, polyphenylene vinylene or polydiacetylene.

4. The method of claim 2, wherein the conductive rigid substrate is a metal substrate, or the conductive rigid substrate comprises a conductive layer and a non-conductive rigid substrate.

5. The method of claim 1, wherein the conductive adhesive layer further comprises silane adhesive, polyimide adhesive, or acrylate adhesive, and conductive particle or conductive polymer.

6. The method of claim 5, wherein the conductive particle comprises gold, silver, copper, aluminum, zinc, iron, nickel conductive particles, the conductive polymer comprise polyacetylene, polythiophene, polypyrrole, polyaniline, polyhenylene, polyphenylene vinylene- or polydiacetylene.

7. The method of claim 5, wherein the conductive rigid substrate is a metal substrate, or the conductive rigid substrate comprises a conductive layer and a non-conductive rigid substrate.

8. The method of claim 1, wherein the conductive rigid substrate is a metal substrate, or the conductive rigid substrate comprises a conductive layer and a non-conductive rigid substrate.

9. The method of claim 8, wherein the conductive layer is an indium tin oxide layer, the non-conductive rigid substrate is a glass substrate.

10. The method of claim 1, wherein the step of aging the adhesive layer comprises aging the adhesive layer by scanning a back side of the conductive rigid substrate with a laser beam or by heating.

* * * * *